(12) United States Patent
Kim et al.

(10) Patent No.: US 9,312,376 B2
(45) Date of Patent: Apr. 12, 2016

(54) SEMICONDUCTOR DEVICE, METHOD FOR FABRICATING THE SAME, AND MEMORY SYSTEM INCLUDING THE SEMICONDUCTOR DEVICE

(71) Applicant: Samsung Electronics Co., Ltd., Gyeonggi-do (KR)

(72) Inventors: Kook-Tae Kim, Hwaseong-si (KR); Young-Tak Kim, Hwaseong-si (KR); Ho-Sung Son, Hwaseong-si (KR); Seok-Jun Won, Seoul (KR); Ji-Hye Yi, Suwon-si (KR); Chul-Woong Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 131 days.

(21) Appl. No.: 14/155,651

(22) Filed: Jan. 15, 2014

(65) Prior Publication Data
US 2014/0369115 A1 Dec. 18, 2014

(30) Foreign Application Priority Data

Jun. 13, 2013 (KR) .......................... 10-2013-0067855

(51) Int. Cl.
*G11C 11/34* (2006.01)
*H01L 29/78* (2006.01)
*H01L 29/66* (2006.01)

(52) U.S. Cl.
CPC ............ *H01L 29/78* (2013.01); *H01L 29/6656* (2013.01); *H01L 29/66545* (2013.01); *H01L 29/66795* (2013.01); *H01L 29/785* (2013.01); *H01L 29/7848* (2013.01)

(58) Field of Classification Search
CPC ............... H01L 29/78; H01L 29/7843; H01L 21/823807; H01L 21/823864; H01L 21/823814; G11C 11/40
USPC .......... 365/182; 257/E21.54, 21.158, 21.585, 257/21.495
See application file for complete search history.

(56) References Cited

U.S. PATENT DOCUMENTS

| 7,446,394 | B2 | 11/2008 | Fukuda et al. | |
|---|---|---|---|---|
| 2002/0076877 | A1 | 6/2002 | Gupta et al. | |
| 2009/0227082 | A1* | 9/2009 | Shin et al. | 438/294 |
| 2011/0156107 | A1* | 6/2011 | Bohr et al. | 257/288 |
| 2011/0171804 | A1 | 7/2011 | Wang et al. | |
| 2011/0241128 | A1 | 10/2011 | O'Meara et al. | |
| 2012/0003806 | A1* | 1/2012 | Wang | 438/305 |
| 2012/0146154 | A1 | 6/2012 | Itou et al. | |

(Continued)

FOREIGN PATENT DOCUMENTS

| JP | 2009-147265 | 7/2009 |
|---|---|---|
| JP | 2010-161229 | 7/2010 |

(Continued)

*Primary Examiner* — Toan Le
(74) *Attorney, Agent, or Firm* — Muir Patent Law, PLLC (57) ABSTRACT

Semiconductor device, method for fabricating the same and electronic devices including the semiconductor device are provided. The semiconductor device comprises an interlayer insulating layer formed on a substrate and including a trench, a gate electrode formed in the trench, a first gate spacer formed on a side wall of the gate electrode to have an L shape, a second gate spacer formed on the first gate spacer to have an L shape and having a dielectric constant lower than that of silicon nitride, and a third spacer formed on the second gate spacer.

18 Claims, 8 Drawing Sheets

(56) References Cited

U.S. PATENT DOCUMENTS

2012/0187459 A1 7/2012 Pan et al.
2012/0256265 A1 10/2012 Fujimoto
2012/0321791 A1 12/2012 Suzuki et al.
2013/0062700 A1* 3/2013 Fujita ............................ 257/368

FOREIGN PATENT DOCUMENTS

| JP | 2011-009526 | 1/2011 |
| JP | 2011-159690 | 8/2011 |
| JP | 2011-165859 | 8/2011 |
| KR | 10-1068637 | 9/2011 |

* cited by examiner

SEMICONDUCTOR DEVICE, METHOD FOR FABRICATING THE SAME, AND MEMORY SYSTEM INCLUDING THE SEMICONDUCTOR DEVICE

CROSS-REFERENCE TO RELATED APPLICATION

This application claims priority from Korean Patent Application No. 10-2013-0067855 filed on Jun. 13, 2013 in the Korean Intellectual Property Office, and all the benefits accruing therefrom under 35 U.S.C. 119, the contents of which in its entirety are herein incorporated by reference.

BACKGROUND

The disclosure relates to a semiconductor device, a method for fabricating the same, and a memory system including the semiconductor device.

As one of scaling technologies which increase a density of a semiconductor device, a transistor in which a fin shaped silicon body is formed on a substrate and a gate is formed on a surface of the silicon body has been suggested.

Such a transistor may use a three-dimensional channel so that scaling is possible. Further, without increasing a gate length of the transistor, a current control capacity may be improved. Furthermore, an SCE (short channel effect) that of a potential in the channel region is affected by a drain voltage may be efficiently suppressed.

SUMMARY

An embodiment of the present invention provides a semiconductor device which uses a spacer structure including a material having a low dielectric constant to reduce a capacitive coupling phenomenon between a gate and a source and/or a drain.

Another embodiment of the present invention provides a method of fabricating a semiconductor device having a spacer structure including a material of a low dielectric constant to reduce a capacitive coupling phenomenon between a gate and a source and/or a drain.

In one aspect of the present invention, there is provided a semiconductor device, comprising an interlayer insulating layer formed on a substrate and including a trench, a gate electrode formed in the trench, a first gate spacer formed on a side wall of the gate electrode to have an L shape, a second gate spacer formed on the first gate spacer to have an L shape, the second gate spacer having a dielectric constant lower than that of silicon nitride, and a third spacer formed on the second gate spacer. The second gate spacer may include SiOCN.

In another aspect of the present invention, there is provided a semiconductor device, comprising an interlayer insulating layer formed on a substrate and including a trench, a gate electrode formed in the trench, a top surface of the gate electrode being disposed on the same plane as a top surface of the interlayer insulating layer, a first gate spacer formed on a side wall of the gate electrode to have an L shape, the first gate spacer including SiOCN, and a second gate spacer formed on the first gate spacer, the second gate spacer including silicon nitride.

Another embodiment provides a method of manufacturing a semiconductor device including steps of forming a dummy gate electrode on a substrate, forming a first spacer on the dummy gate electrode, forming a second spacer on the first spacer, forming a source and a drain on the sides of the first and the second spacers, forming an interlayer insulating layer on the source and the drain, forming a trench by removing the dummy gate electrode, forming a gate dielectric film in the trench, and forming a gate electrode on the gate dielectric film, wherein the dielectric constant of the first spacer is lower than the dielectric constant of the second spacer. The first spacer may include SiOCN.

Some other embodiments provide memory systems including an aforementioned semiconductor device. These memory systems may include a memory card, an information processing system and/or an electronic device.

BRIEF DESCRIPTION OF THE DRAWINGS

The above and other features and advantages of the present disclosure will become more apparent by describing embodiments in detail with reference to the attached drawings in which.

DETAILED DESCRIPTION OF THE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may not illustrate the actual shape of a region of a device.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to an embodiment of the present invention will be described with reference to FIG. 1.

Figure 1:
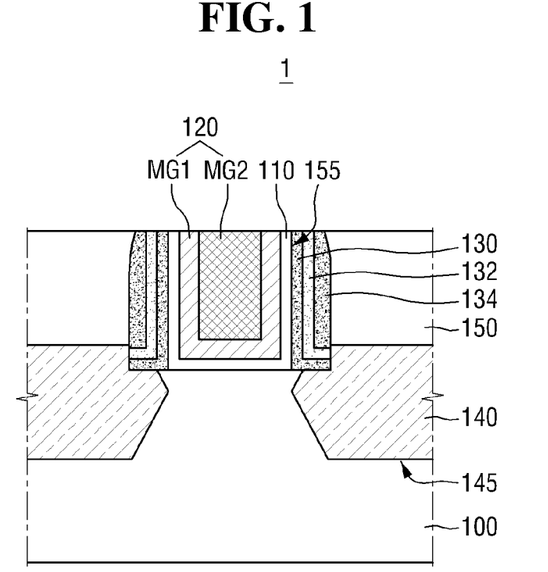
FIG. 1 is a diagram illustrating a semiconductor device according to an embodiment of the present invention.

FIG. 1 is a diagram illustrating a semiconductor device according to an embodiment of the present invention. The semiconductor device of FIG. 1 may include a lightly doped impurity region LDD and/or a Halo ion region, but are not shown in FIG. 1 to better communicate aspect of this disclosure.

Referring to FIG. 1, a semiconductor device 1 according to an embodiment of the present invention includes a gate electrode 120, a gate dielectric film 110, a first gate spacer 130, a second gate spacer 132, a third gate spacer 134, and an interlayer insulating layer 150.

The substrate 100 may be a bulk silicon or an SOI (silicon-on-insulator). Alternatively, the substrate 100 may be a silicon substrate or may contain other materials, for example, silicon germanium, indium antimonide, lead telluride compound, indium arsenide, indium phosphide, gallium arsenide, or gallium antimonide. Further, the substrate 100 may be formed such that an epitaxial layer is formed on a base substrate.

A source/drain 140 may be formed at both sides of the gate electrode 120. The source/drain 140 may be formed in a recess 145 formed in a substrate 100. The source/drain 140 may be formed to protrude further than a boundary between the substrate 100 and the gate dielectric film 110, that is, may be an elevated source/drain, but is not limited thereto.

As shown in FIG. 1, a cross-section of the recess 145 in which the source/drain 140 is formed may have a sigma ($\Sigma$) shape, but is not limited thereto.

When the semiconductor device 1 is a PMOS fin type transistor, the source/drain 140 may include a compressive stress material. For example, the compressive stress material may be a material which has a larger lattice constant than Si and for example, may be SiGe. The compressive stress material applies a compressive stress to the source/drain 140 to improve the mobility of a carrier of a channel region.

In contrast, when the semiconductor device 1 is an NMOS fin type transistor, the source/drain 140 may be formed of the same material as the substrate 100 or a tensile stress material. For example, when the substrate 100 is Si, the source/drain 140 may be Si or a material which has a lower lattice constant than Si (for example, SiC).

The interlayer insulating layer 150 is formed on the substrate 100 and covers the source/drain 140. The interlayer insulating layer 150 includes a trench 155. The interlayer insulating layer 150 may include at least one of a material having a low dielectric constant, an oxide film, a nitride film, and an oxynitride film. Examples of the material having a low dielectric constant may include FOX (flowable oxide), TOSZ (tonen silazene), USG (undoped silica glass), BSG (borosilica glass), PSG (phosphoSilaca glass), BPSG (borophosphosilica glass), PRTEOS (plasma enhanced tetra ethyl ortho silicate), FSG (fluoride silicate glass), HDP (high density plasma), PEOX (plasma enhanced oxide), and FCVD (flowable CVD) and a combination thereof, but are not limited thereto.

The gate electrode 120 is formed in the trench 155. The gate electrode 120 may be a replacement gate electrode which is formed by a replacement process. A top surface of the gate electrode 120 and a top surface of the interlayer insulating layer 150 may be disposed on the same plane.

The gate electrode 120 may include two or more metal layers. As illustrated in the drawing, the gate electrode 120 may be formed of metal layers MG1 and MG2 laminated layer by layer. The first metal layer MG1 may control a work function and the second metal layer MG2 may fill a space formed by the first metal layer MG1. The first metal layer MG1 may be formed along a side and a bottom surface of the trench 155. For example, the first metal layer MG1 may include at least one of TiN, TaN, TiC, and TaC. The second metal layer MG2 may include W or Al.

The gate dielectric film 110 may be formed between the substrate 100 and the gate electrode 120. The gate dielectric film 110 may be formed along the side and the bottom surface of the trench 155. The gate dielectric film 110 may include a high dielectric material having a dielectric constant higher than that of the silicon oxide film. For example, the gate dielectric film 110 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

Spacers 130, 132, and 134 having a triple structure may be formed on a side wall of the gate electrode 120. The triple structure spacer may include a first gate spacer 130, a second gate spacer 132, and a third gate spacer 134.

The first gate spacer 130 may be formed on the side wall of the gate electrode 120. In other words, the first gate spacer 130 may be formed on the gate dielectric film 110 which is formed on the side of the trench 155. The first gate spacer 130 may be formed so as to be in contact with the gate dielectric film 110.

The first gate spacer 130 may be formed on the substrate 100 to have an L shape. Accordingly, a part of the first gate spacer 130 may be formed so as to be in contact with the gate dielectric film 110.

The first gate spacer 130 may include a material having a high etching selectivity, for example, silicon nitride.

The second gate spacer 132 may be formed on the first gate spacer 130. Specifically, the second gate spacer 132 may be formed to have an L shape and formed on the L-shaped first gate spacer 130.

The second gate spacer 132 may include a material having a dielectric constant which is lower than the first gate spacer 130 and the third gate spacer 134. Specifically, the second gate spacer 132 may include a material having a dielectric constant lower than that of the silicon nitride. The second gate spacer 132 may include a material having a dielectric constant higher than that of the silicon oxide. Even though the second gate spacer 132 has a dielectric constant lower than that of the silicon nitride, the second gate spacer 132 may have an etching selectivity similar to that of the silicon nitride. Here, the etching selectivity of the second gate spacer 132 may be similar to an etching selectivity of a material including silicon oxide.

For example, the second gate spacer 132 may include SiOCN or SiOC. The dielectric constant of the second gate spacer 132 may have a value between 4 and 6.

The third gate spacer 134 may be formed on the second gate spacer 132. The third gate spacer 134 may not have an L shape, which is different from the first gate spacer 130 and the second gate spacer 132.

Similarly to the first gate spacer 130, the third gate spacer 134 may include an etching resistant material, for example, silicon nitride.

The second gate spacer 132 interposed between the first gate spacer 130 and the third gate spacer 134 may be formed to be directly in contact with not only the first gate spacer 130 but also the third gate spacer 134. The second gate spacer 132 may be formed between the first gate spacer 130 and the third gate spacer 134 so that an exposed area of the second gate spacer 132 may be reduced.

Spacers 130, 132, and 134 having a triple structure may be formed on a side wall of the gate electrode 120. For example, the first gate spacer 130 and the third gate spacer 134 may be formed of silicon nitride and the second gate spacer 132 may be formed of SiOCN. The second gate spacer 132 may include a material having a lower dielectric constant than those of the first gate spacer 130 and the third gate spacer 134. The second gate spacer 132 may include a material having a lower dielectric constant than those of the first gate spacer 130 and the third gate spacer 134 which may include silicon nitride so that a total dielectric constant of the spacers 130, 132, and 134 having a triple structure may be lowered than those of the first and the third spacers. By doing this, a capacitive coupling between the gate electrode 120 and the source/drain 140 may be lowered. By lowering the capacitive coupling, an AC performance of the semiconductor device 1 may be improved.

Figure 2:
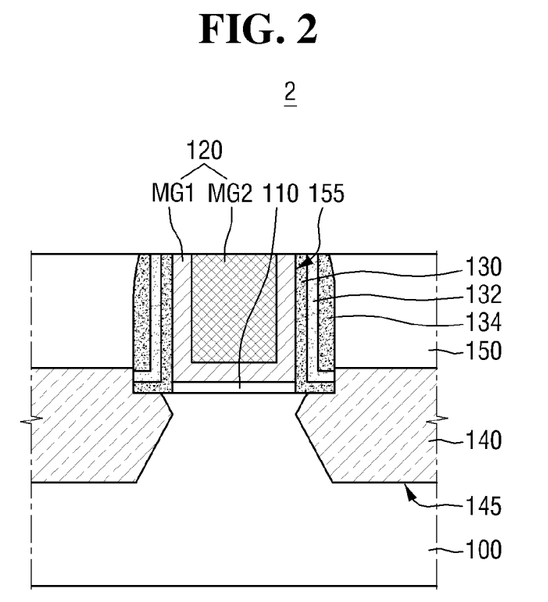
FIG. 2 is a diagram illustrating a semiconductor device according to another embodiment of the present invention.

A semiconductor device according to another embodiment of the present invention will be descried with reference to FIG. 2. This embodiment is substantially identical to the above embodiment except the shape of the gate dielectric film 110 so that like parts in the above-described embodiment are denoted by like reference numerals and the description thereof will be made in brief or omitted.

FIG. 2 is a diagram illustrating a semiconductor device according to another embodiment of the present invention.

Referring to FIG. 2, a semiconductor device 2 according to another embodiment of the present invention may include a gate electrode 120, a gate dielectric film 110, a first gate spacer 130, a second gate spacer 132, a third gate spacer 134, and an interlayer insulating layer 150.

The gate electrode 120 is formed in the trench 155, and may be formed by a replacement process. A first metal layer MG1 of the gate electrode 120 is formed along a side and a bottom surface of the trench 155. In FIG. 1, the gate dielectric film 110 is interposed between the first metal layer MG1 and the first gate spacer 130 so that the first metal layer MG1 does not contact the first gate spacer 130. However, the first metal layer MG1 instead may be formed to be in contact with the first gate spacer 130, such as with the semiconductor device 2 as illustrated in FIG. 2.

The gate dielectric film 110 may be formed between the substrate 100 and the gate electrode 120. The gate dielectric film 110 may be formed on the bottom surface of the trench 155, but may not be formed on the side of the trench 155. As described below, during the replacement process to form the gate electrode 120, the gate dielectric film 110 may not be removed while the dummy gate electrode (not shown) formed on the gate dielectric film 110 is removed. Alternatively, a dummy gate dielectric film (not shown) may be removed while removing the dummy gate (not shown) and the gate dielectric film 110 may be formed at the bottom surface of the trench 155. Therefore the gate dielectric film 110 may be formed only on the bottom surface of the trench 155.

In the semiconductor device 2, the first gate spacer 130 may be formed to be in contact with the gate electrode 120 and the gate dielectric film 110. That is, a lower portion of the first gate spacer 130 may be in contact with the gate dielectric film 110 and an upper portion of the first gate spacer 130 may be in contact with the gate electrode 120.

Figure 3:
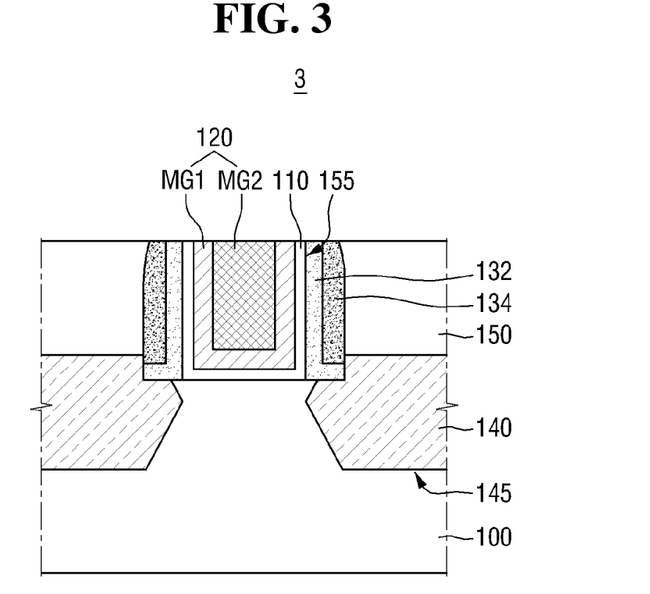
FIG. 3 is a diagram illustrating a semiconductor device according to another embodiment of the present invention.

A semiconductor device according to another embodiment of the present invention will be descried with reference to FIG. 3. This embodiment is substantially identical to the above embodiment described with reference to FIG. 1 except that the first gate spacer 130 is not included so that the difference will be mainly described.

FIG. 3 is a diagram illustrating a semiconductor device according to another embodiment of the present invention.

Referring to FIG. 3, a semiconductor device 3 includes a gate electrode 120, a gate dielectric film 110, a second gate spacer 132, a third gate spacer 134, and an interlayer insulating layer 150.

In the semiconductor device 3, spacers 132 and 134 forming a double layer structure are formed on a side wall of the gate electrode 120. The spacers 132 and 134 forming a double layer structure include a second gate spacer 132 and a third gate spacer 134.

The second gate spacer 132 may be formed on the side wall of the gate electrode 120. In other words, the second gate spacer 132 may be formed on the gate dielectric film 110 which is formed on the side of the trench 155. The second gate spacer 132 may be formed so as to be in contact with the gate dielectric film 110.

The second gate spacer 132 may be formed on the substrate 100 to have an L shape. Accordingly, a part of the second gate spacer 132 may be formed so as to be in contact with the gate dielectric film 110.

The second gate spacer 132 may include a material having a dielectric constant lower than that of silicon nitride. The second gate spacer 132 may include a material having a dielectric constant higher than that of the silicon oxide. Even though the second gate spacer 132 has a dielectric constant which is lower than that of the silicon nitride, the second gate spacer 132 may have an etching selectivity which is similar to that of the silicon nitride. For example, the second gate spacer 132 may include SiOCN or SiOC.

The third gate spacer 134 may be formed on the second gate spacer 132. The third gate spacer 134 may not have an L shape, which is different from the second gate spacer 132.

The third gate spacer 134 may include an etching resistant material, for example, silicon nitride.

A method of fabricating a semiconductor device according to an embodiment of the present invention will be described with reference to FIGS. 1, 4 to 12.

FIGS. 4 to 12 are diagrams illustrating intermediate processes of a method of fabricating a semiconductor device according to an embodiment of the present invention.

Figure 4:
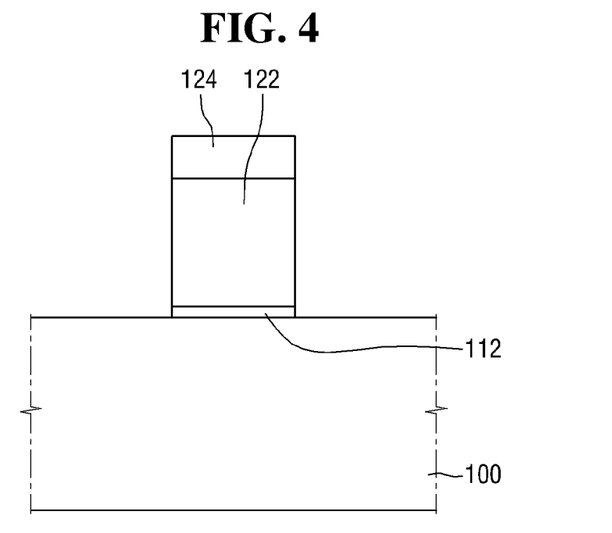
FIGS. 4 to 12 are diagrams illustrating intermediate processes of a method of fabricating a semiconductor device according to an embodiment of the present invention.

Referring to FIG. 4, a dummy gate dielectric film 112, a dummy gate electrode 122, and a gate hardmask 124 which are sequentially laminated on the substrate 100 are formed.

In the method of fabricating a semiconductor device according to an embodiment of the present invention, the substrate 100 is considered to be a silicon substrate.

A dummy dielectric film, a dummy electrode film, and a hardmask film may be sequentially formed on the substrate 100. The dummy dielectric film may include one of a silicon oxide film ($SiO_2$), a silicon oxynitride film (SiON) and a combination thereof. The dummy dielectric film may be formed using, for example, thermal treatment, chemical treatment, an atomic layer deposition (ALD) method, or a chemical vapor deposition (CVD) method. The dummy electrode film may be, for example, a silicon layer, and specifically may include one of poly silicon (poly Si), amorphous silicon (a-Si), and a combination thereof. The poly silicon may be formed using a chemical vapor deposition method and the amorphous silicon may be formed using a sputtering method, a chemical vapor deposition method, or a plasma deposition method, but the invention is not limited thereto. The hardmask film may include one of a nitride film, an oxide film, and a combination thereof. The hardmask film may be formed using a chemical vapor deposition method.

Next, the dummy dielectric film, the dummy electrode film, and a hardmask film are patterned to form the dummy gate dielectric film 112, the dummy gate electrode 122, and the gate hardmask 124 on the substrate 100.

The dummy gate dielectric film 112 may be formed between the dummy gate electrode 122 and the substrate 100. The dummy gate dielectric film 112 may be removed in a subsequent process, but the invention is not limited thereto. In other words, a gate dielectric film formed between the dummy gate electrode 122 and the substrate 100 may not be removed in the subsequent process and may include a material having a high dielectric constant.

Figure 5:
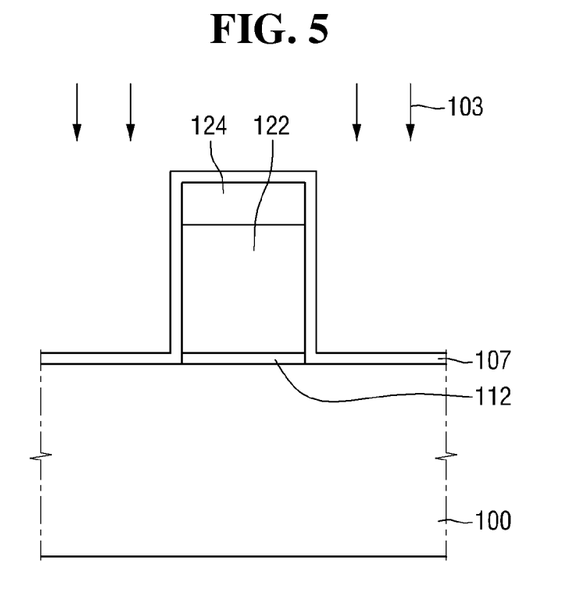

Referring to FIG. 5, an impurity region is formed on both sides of the dummy gate electrode 122 using an ion implantation process 103. The impurity region is formed in the substrate 100.

In the method of fabricating a semiconductor device according to an embodiment of the present invention, the impurity region may be a lightly doped impurity region LDD and/or a Halo ion region.

Specifically, a liner film 107 is formed on the substrate 100 and the dummy gate electrode 122. The liner film 107 may be conformally formed along the substrate 100 and the dummy gate electrode 122. For example, the liner film 107 may include a silicon nitride film and may be formed using an atomic layer deposition method or a chemical vapor deposition method.

Next, the ion implantation process 103 is used to inject the impurity in the substrate 100. The impurity which is injected by the ion implantation process 103 passes through the liner film 107 to be injected into the substrate 100. In the ion implantation process 103, the dummy gate electrode 122 serves as a mask so that the impurity region is formed at both sides of the dummy gate electrode 122.

Next, at least a part of the liner film 107 is removed. The liner film 107 may be removed by a wet etching process. The removal of the liner film 107 may correspond to a cleaning process which will be subsequently preformed in order to form spacer films.

Figure 6:
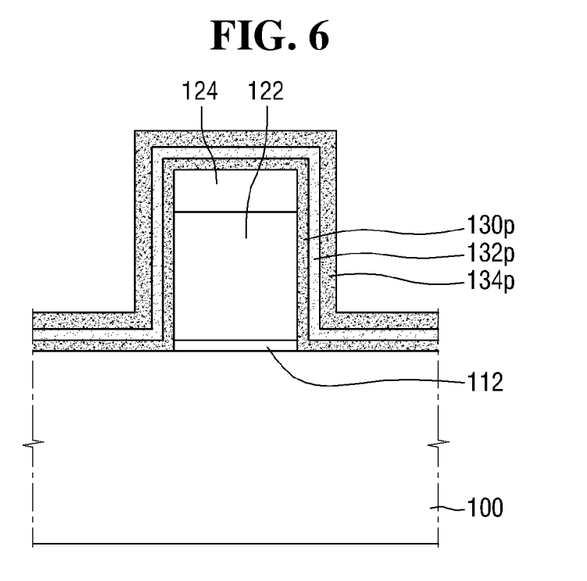

Referring to FIG. 6, a first spacer film 130p, a second spacer film 132p, and a third spacer film 134p which cover the dummy gate electrode 122 are sequentially formed on the substrate 100. The first spacer film 130p, the second spacer film 132p, and the third spacer film 134p may be conformally formed along the substrate 100 and the dummy gate electrode 122.

The first spacer film 130p may include silicon nitride and may be formed using an atomic layer deposition method or a chemical vapor deposition method. The second spacer film 132p may include a dielectric material having a lower dielectric constant than silicon nitride and for example, include SiOCN or SiOC. The second spacer film 132p may be formed using an atomic layer deposition method or a chemical vapor deposition method. The third spacer film 134p may include silicon nitride and may be formed using an atomic layer deposition method or a chemical vapor deposition method.

When the second spacer film 132p is an SiOCN film, a silicon precursor, an oxygen precursor, a carbon precursor, and a nitrogen precursor are used to form the second spacer film 132p as an SiOCN single layer. The second spacer film 132p may be an SiOCN film formed by repeatedly laminating the SiON film and the SiCN film.

When the second spacer film 132p is an SiOC film, the second spacer film 132p may be formed as an SiOC single layer by an atomic layer deposition method which uses a silicon precursor, an oxygen precursor, and a carbon precursor.

In the method of fabricating a semiconductor device according to an embodiment of the present invention, the first spacer film 130p, the second spacer film 132p, and the third spacer film 134p may be formed in-situ, but are not limited thereto. For example, the first spacer film 130p, the second spacer film 132p, and the third spacer film 134p may be formed in-situ using an atomic layer deposition method.

In another embodiment, the gate spacer may have double layer spacer structure, such as that shown in FIG. 3. In this case, only the second spacer film 132p and the third spacer film 134p may be conformally formed along the substrate 100 and the dummy gate electrode 122.

Figure 7:
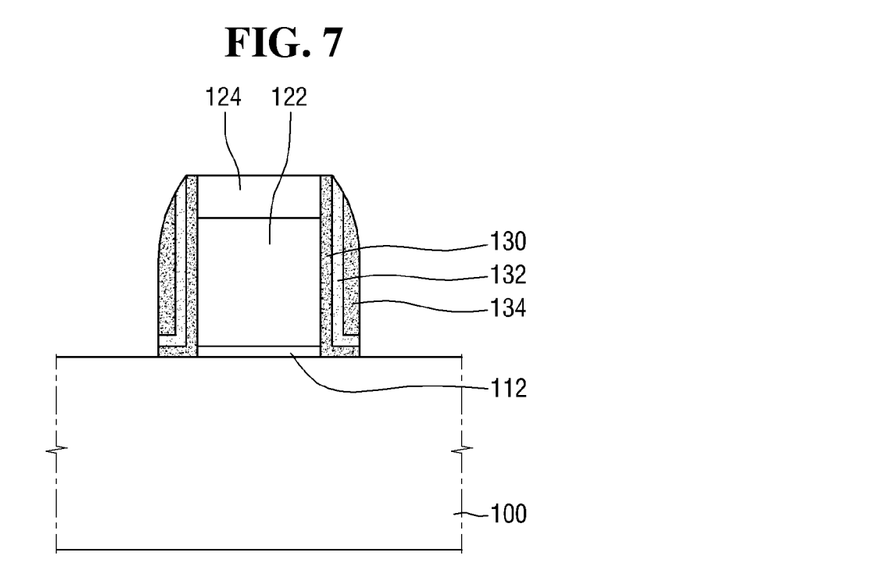

Referring to FIG. 7, the first gate spacer 130, the second gate spacer 132, and the third gate spacer 134 may be successively formed at both side walls of the dummy gate electrode 122.

The first gate spacer 130, the second gate spacer 132, and the third gate spacer 134 may be simultaneously formed.

The first spacer film 130p, the second spacer film 132p, and the third spacer film 134p may be conformally formed on the substrate 100 and the dummy gate electrode 122. The first spacer film 130p, the second spacer film 132p, and the third spacer film 134p may be etched in one etching process. The etching process which etches the first spacer film 130p, the second spacer film 132p, and the third spacer film 134p may be a dry etching process. When the first spacer film 130p, the second spacer film 132p, and the third spacer film 134p are etched in one etching process, the first gate spacer 130, the second gate spacer 132, and the third gate spacer 134 are simultaneously formed.

The first gate spacer 130 may be formed at both side walls of the dummy gate electrode 122 to have an L shape. The second gate spacer 132 may be formed on the first gate spacer 130 to have an L shape. The third gate spacer 134 may be formed on the second gate spacer 132.

An exposed portion of the second gate spacer 132 may be reduced by the first gate spacer 130 and the third gate spacer 134 because the first gate spacer 130 and the third gate spacer 134 cover both sides of the second gate spacer 132.

Figure 8:
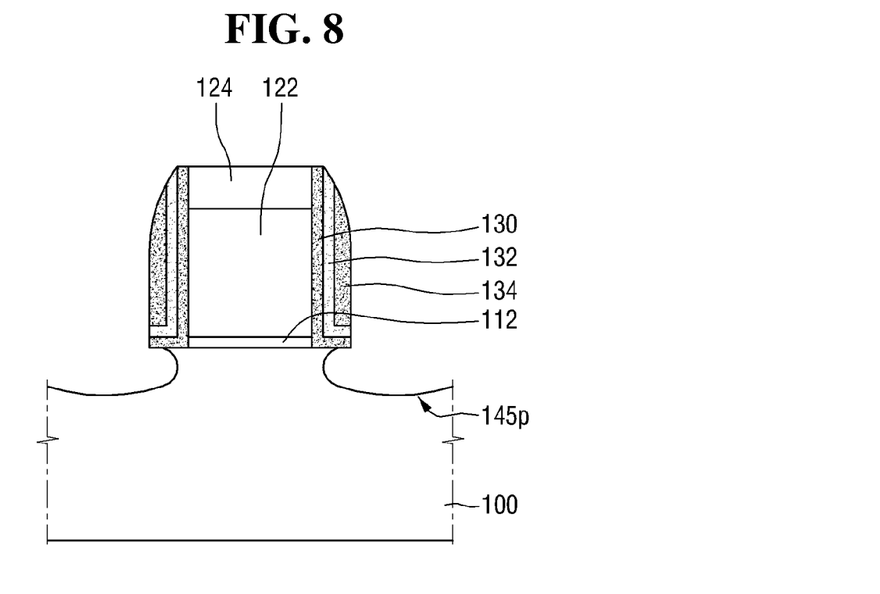

Referring to FIG. 8, a pre recess 145p is formed at both sides of the dummy gate electrode 122. In other words, the substrate 100 is etched to form the pre recess 145p at sides of the first to third gate spacers 130, 132, and 134.

The pre recess 145p may be formed using an isotropic dry etching process. When the substrate 100 is a silicon substrate, etching gas used for the dry etching process may contain fluorine (F).

Hereinafter, a role of the third gate spacer 134 including silicon nitride will be described.

When the dry etching process is performed to form the pre recess 145p without the third gate spacer 134, the second gate spacer 132 including SiOCN or SiOC is exposed to the etching gas including fluorine. Carbon on the exposed surface of the second gate spacer 132 is also exposed to the etching gas. The exposed carbon is coupled with the fluorine which may be used to etch the substrate 100 so that the concentration of fluorine plasma is lowered in the chamber where the dry etching process is performed. The carbon in the second gate spacer 132 may be sputtered or out-gassed to react with fluorine and form a C—F polymer which may interrupt the dry etching.

Figure 9:
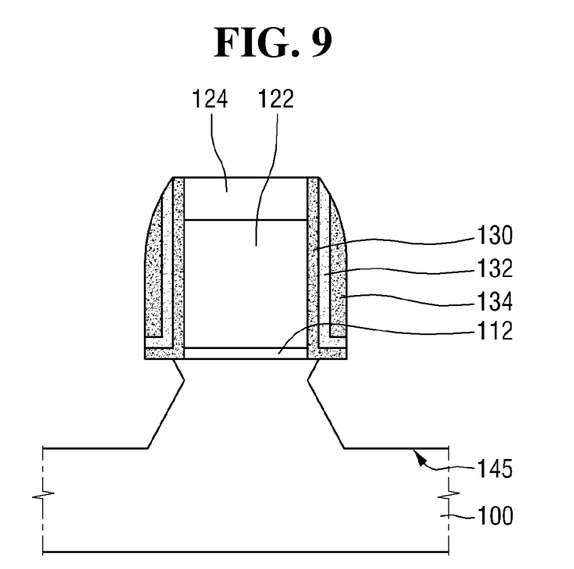

In a recess forming process illustrated in FIG. 9, it may be difficult to adjust the tip position of the recess 145 when the concentration of fluorine plasma is lowered or the C—F polymer is formed in the chamber where the dry etching process is performed. The tip of the recess 145 may be disposed at a lower position from the top surface of the substrate 100 and/or the tip may not overlap the dummy gate electrode 122.

By forming the third gate spacer 134 on the second gate spacer 132 as shown in FIG. 9, an area where the second gate spacer is exposed during the etching process may be reduced. Thus, the influence of the carbon in the second gate spacer 132 during etching may be minimized.

The first gate spacer 130 may prevent carbon included in the second gate spacer 132 from spreading to the substrate 100.

Referring to FIG. 9, the recess 145 is formed at both sides of the dummy gate electrode 122. Specifically, the recess 145 may be formed by etching the substrate 100 from the side portions of the gate spacers 130, 132, and 134.

Specifically, the recess 145 is formed at both sides of the dummy gate electrode 122 by etching the pre recess 145p. For example, the recess 145 may be formed using a wet etching process. The recess 145 may be formed along a crystal face of silicon and may have a sigma shape in its cross section.

In a method of fabricating a semiconductor device according to an embodiment of the present invention, the pre recess 145p may be formed by an isotropic dry etching process and the recess 145 may be formed by a wet etching process, but the invention is not limited thereto. In other words, the pre recess 145p and the recess 145 may be formed by an anisotropic dry etching process. In this case, a cross-section of the recess 145 may be a box-shape.

Figure 10:
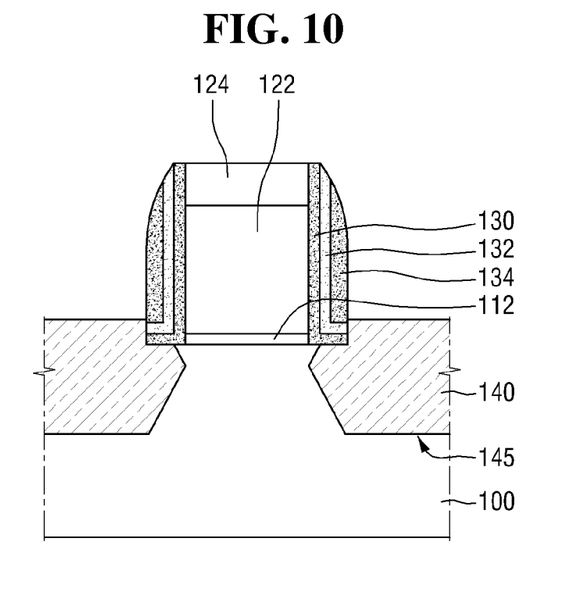

Referring to FIG. 10, a source/drain 140 is formed in the recess 145. A top surface of the source/drain 140 formed in the recess 145 may be elevated higher than the top surface of the substrate 100. That is, the source/drain 140 may be an elevated source/drain 140.

By an epitaxial process, the source/drain 140 may be formed by epitaxially growing a semiconductor material in the recess 145. That is, the source/drain 140 may be a single crystalline epitaxial layer. A material for the source/drain 140 may vary depending on whether the semiconductor devices 1 to 3 are n type transistors or p type transistors. Further, if necessary, the impurity may be doped in-situ in the epitaxial process.

Figure 11:
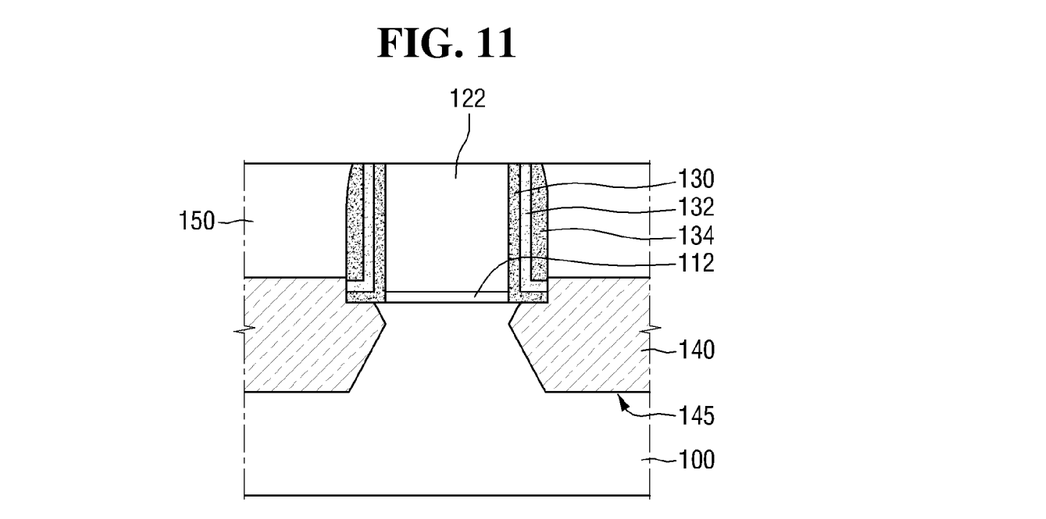

Referring to FIG. 11, an interlayer insulating layer 150 may be formed to cover the elevated source/drain 140, the dummy gate electrode 122, and the first to third gate spacers 130, 132, and 134. The interlayer insulating layer 150 may include a material having a low dielectric constant, an oxide film, a nitride film, and/or an oxynitride film.

Next, the interlayer insulating layer 150 is planarized to expose the top surface of the dummy gate electrode 122. For example, the planarizing process may use a CMP (chemical mechanical polishing) process.

In FIG. 11, it is illustrated that the first gate spacer 130, the second gate spacer 132, and the third gate spacer 134 are exposed by the planarizing process, but the invention is not limited thereto. For example, if the etching profile of the first gate spacer 130 is higher than those of the second and the third gate spacers 132 and 134, the second gate spacer 132 and/or the third gate spacer 134 may not be exposed.

Figure 12:
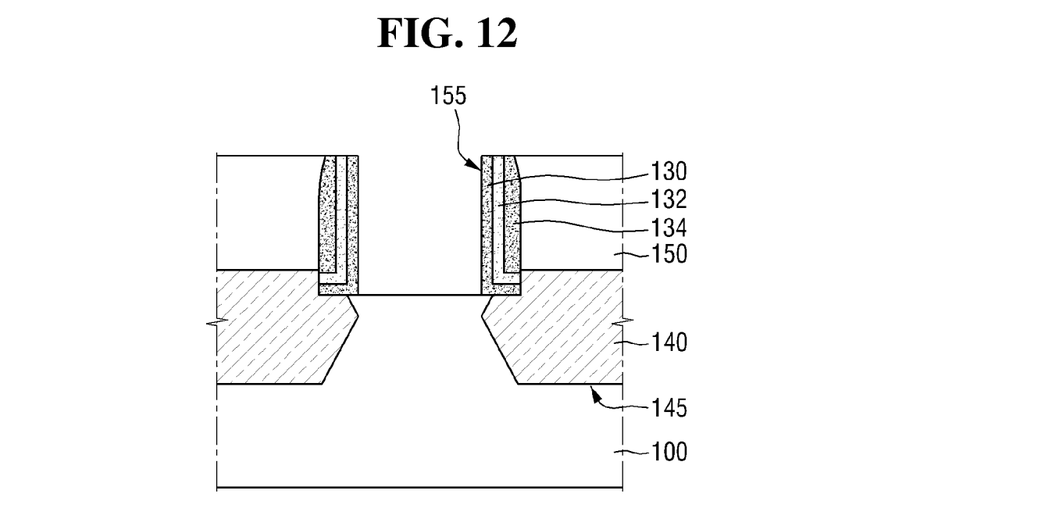

Referring to FIG. 12, the dummy gate electrode 122 is removed. After removing the dummy gate electrode 122, the dummy gate dielectric film 122 is removed to form the trench 155 in the interlayer insulating layer 150. The top surface of the substrate 100 may be exposed at the bottom of the trench 155.

In this example, the bottom surface of the trench 155 is the top surface of the substrate 100 and the side of the trench 155 is the first gate spacer 130.

The dummy gate electrode 122 may be removed using a wet process or a dry process. The wet etching process will be described in detail. The dummy gate electrode 122 is exposed in an aqueous solution containing a hydroxide source for a sufficient time at a sufficient temperature so that the dummy gate electrode 122 may be substantially removed. The hydroxide source may include ammonium hydroxide, tetraalkyl ammonium hydroxide, or TMAH (tetramethyl ammonium hydroxide), but is not limited thereto.

The dummy gate dielectric film 112 may be removed by a wet etching method, a dry etching method, or a combination thereof. It is obvious that the etching solution or the etching gas may vary depending on the material of the dummy gate dielectric film 112.

In the method of fabricating a semiconductor device according to the embodiment of the present invention described above, both the dummy gate electrode 122 and the dummy gate dielectric film 112 are removed to expose the top surface of the substrate 100, but the invention is not limited thereto. For example, in FIG. 4, when a real gate dielectric film of a transistor is formed instead of the dummy gate dielectric film 112, only the dummy gate electrode 122 is removed.

Referring to FIG. 1, the gate dielectric film 110 and the gate electrode 120 are formed in the trench 155. The gate electrode 120 may be a buried metal gate.

The gate dielectric film 110 may include an interfacial layer formed on the bottom surface of the trench 155. The interfacial layer may include a silicon oxide film and may be formed by a chemical oxidation method, a UV oxidation method, or a dual plasma oxidation method.

Thereafter, a dielectric film is conformally formed on the sides and the bottom surface of the trench 155 and the top surface of the interlayer insulating layer 150. The dielectric film may include a high dielectric material having a dielectric constant which is higher than that of the silicon oxide film.

Thereafter, the gate electrode film is formed on the dielectric film. The gate electrode film may include a lower electrode film and an upper electrode film. The lower electrode film is formed along the sides and the bottom surface of the trench 155 and the top surface of the interlayer insulating layer 150 and the upper electrode film covers the trench 155 and the top surface of the interlayer insulating layer 150. The upper electrode film may fill the trench 155.

Thereafter, the dielectric film and the gate electrode film which are formed on the top surface of the interlayer insulating layer 150 are removed by a planarizing process. By the planaring process, the top surface of the interlayer insulating layer 150 is exposed and the gate dielectric film 110 and the gate electrode 120 are formed in the trench 155.

The top surface of the gate electrode 120 and the top surface of the interlayer insulating layer 150 may be disposed on the same plane by the planarizing process.

In the examples described herein, the semiconductor devices (e.g, 1 and 2) may constitute transistors, such as a multi-gate transistors or FinFET transistors.

Figure 13:
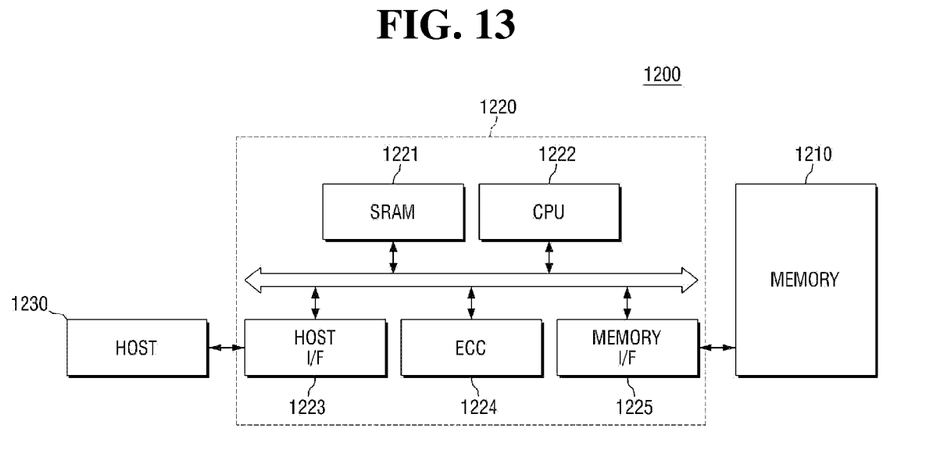
FIG. 13 is a block diagram illustrating a memory card including a semiconductor device according to an embodiment of the present invention.

FIG. 13 is a block diagram illustrating a memory card according to an embodiment of the present invention.

Referring to FIG. 13, a memory card 1200 includes a memory 1210. The memory 1210 may include a semiconductor device fabricated according to one of the various embodiments described above. The memory card 1200 may include a memory controller 1220 which controls data exchange between a host 1230 and the memory 1210. An SRAM 1221 may be used as an operating memory of a central processing unit 1222. A host interface 1223 may include a protocol which allows the host 1230 to access the memory card 1200 to exchange data. An error correction code 1224 detects and corrects errors of data which are read from the memory 1210. A memory interface 1225 interfaces with the memory 1210. The central processing unit 1222 performs an entire control operation related with the data exchange of the memory controller 1220.

Figure 14:
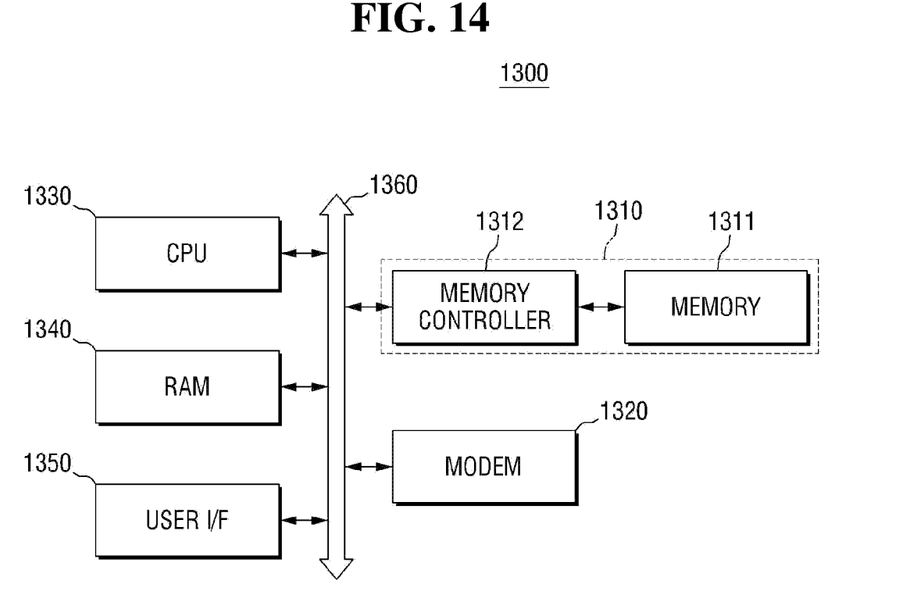
FIG. 14 is a block diagram of an information processing system using a semiconductor device according to an embodiment of the present invention.

FIG. 14 is a block diagram of an information processing system according to an embodiment of the present invention. The information processing system may use a semiconductor device described above.

Referring to FIG. 14, an information processing system 1300 may include a memory system 1310 including a semiconductor device fabricated according to one of the various embodiments described above. The information processing system 1300 may include a memory system 1310, a modem 1320, a central processing unit 1330, an RAM 1340, and a user interface 1350 which are electrically connected to a system bus 1360. The memory system 1310 may include a memory 1311 and a memory controller 1312 and may have a substantially same configuration as the memory card 1200 illustrated in FIG. 13. Data which is processed by the central processing unit 1330 and data which is received from an external device may be stored in the memory system 1310. The information processing system 1300 may be adopted in a memory card, an SSD, a camera image sensor, and/or other various chipsets. For example, the memory system 1310 may be configured to adopt the SSD. The information processing system 1300 may stably and reliably process a large quantity of data.

Figure 15:
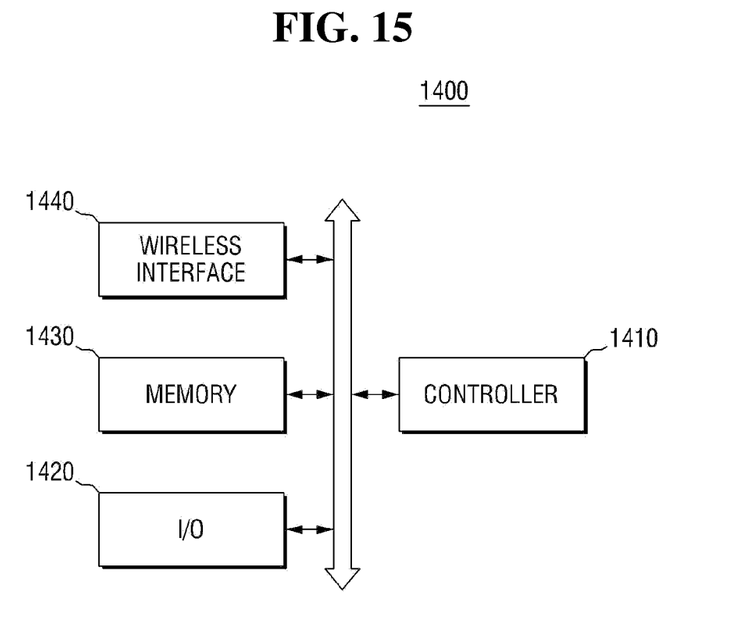
FIG. 15 is a block diagram of an electronic device including a semiconductor device according to an embodiment of the present invention.

FIG. 15 is a block diagram of an electronic device according to the embodiments of the present invention.

Referring to FIG. 15, an electronic device 1400 may include a semiconductor device which is fabricated according to one of the various embodiments described above. The electronic device 1400 may be used for wireless communication equipment (for example, a PDA, a notebook computer, a portable computer, a web tablet, a wireless phone and/or a wireless digital sound player) or various equipment which exchanges information in a wireless communication environment.

The electronic device 1400 may include a controller 1410, an input/output device 1420, a memory 1430, and a wireless interface 1440. Here, the memory 1430 may include a semiconductor device which is fabricated according to one of the various embodiments described above. The controller 1410 may include a microprocessor, a digital signal processor, or similar processors thereto. The memory 1430 may be used to store a command (or user data) processed by the controller 1410. The wireless interface 1440 may be used to exchange data through a wireless data network. The wireless interface 1440 may include an antenna and/or a wireless transceiver. The electronic device 1400 may use a third generation communication system protocol such as CDMA, GSM, NADC, E-TDMA, WCDMA, and CDMA2000.

The foregoing is illustrative of embodiments of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device, comprising:
an interlayer insulating layer formed on a substrate and including a trench;
a gate electrode formed in the trench and including a first metal layer and a second metal layer, the first metal layer formed along a side and a bottom surface of the trench and the second metal layer filling a space formed by the first metal layer;
a gate dielectric film formed between the substrate and the gate electrode;
a first gate spacer including silicon nitride formed on the sidewall of the gate electrode and the gate dielectric film;
a second gate spacer formed on the first gate spacer and having a dielectric constant lower than the dielectric constant of silicon nitride;
a third spacer formed on the second gate spacer; and
an elevated source/drain formed in a recess formed in the substrate and including SiGe,
wherein the first gate spacer directly contacts the gate dielectric film, and a top surface of the elevated source/drain is higher than a top surface of the gate dielectric film under the gate electrode.

2. The semiconductor device of claim 1, wherein the second gate spacer has a dielectric constant which is higher than that of silicon oxide.

3. The semiconductor device of claim 2, wherein the second gate spacer includes SiOCN or SiOC.

4. The semiconductor device of claim 3, wherein the dielectric constant of the second gate spacer has a value between 4 and 6, and the first and the second gate spacers have bottom portions respectively protrude away from the sidewall of the gate electrode and the gate dielectric film.

5. The semiconductor device of claim 1, wherein the third gate spacer includes silicon nitride.

6. The semiconductor device of claim 1, wherein a top surface of the interlayer insulating layer and a top surface of the gate electrode are disposed on the same plane.

7. The semiconductor device of claim 1, wherein the gate dielectric film includes hafnium oxide.

8. The semiconductor device of claim 1, wherein the first metal layer includes TiN.

9. The semiconductor device of claim 8, wherein the second metal layer includes Al.

10. A semiconductor device, comprising:
an interlayer insulating layer formed on a substrate and including a trench;
a gate electrode formed in the trench and including a first metal layer and a second metal layer, the first metal layer formed along a side and a bottom surface of the trench and the second metal layer filling a space formed by the first metal layer;
a gate dielectric film formed between the substrate and the gate electrode;
a first gate spacer including silicon nitride formed on the sidewall of the gate electrode and the gate dielectric film, the first gate spacer having a bottom portion protruding away from the sidewall of the gate electrode;
a second gate spacer formed on the first gate spacer and having a dielectric constant lower than the dielectric constant of silicon nitride;
a third spacer formed on the second gate spacer; and
an elevated source/drain formed in a recess formed in the substrate and including SiGe,
wherein the first gate spacer directly contacts the gate dielectric film, and a top surface of the elevated source/drain is higher than a top surface of the gate dielectric film under the gate electrode.

11. The semiconductor device of claim 10, wherein the second gate spacer has a dielectric constant which is higher than that of silicon oxide.

12. The semiconductor device of claim 11, wherein the second gate spacer includes SiOCN or SiOC.

13. The semiconductor device of claim 12, wherein the dielectric constant of the second gate spacer has a value between 4 and 6, and the first and the second gate spacers respectively have L shapes.

14. The semiconductor device of claim 10, wherein the third gate spacer includes silicon nitride.

15. The semiconductor device of claim 10, wherein a top surface of the interlayer insulating layer and a top surface of the gate electrode are disposed on the same plane.

16. The semiconductor device of claim 10, wherein the gate dielectric film includes hafnium oxide.

17. The semiconductor device of claim 10, wherein the first metal layer includes TiN.

18. The semiconductor device of claim 17, wherein the second metal layer includes Al.